United States Patent
Madonna et al.

(10) Patent No.: US 11,777,303 B2
(45) Date of Patent: *Oct. 3, 2023

(54) LEAKAGE CURRENT BASED REMOTE MONITORING DEVICE AND METHOD FOR DISCONNECTOR DEVICES

(71) Applicant: HITACHI ENERGY SWITZERLAND AG, Baden (CH)

(72) Inventors: Gian-Luigi Madonna, Otelfingen (CH); Xavier Kornmann, Lauchringen (DE); Daniel Neeser, Thalwil (CH); Stefano Bertoli, Wettingen (CH); Ektor Sotiropoulos, Horgen (CH); Martin Schick-Pauli, Zürich (CH); Alexander Fach, Boppelsen (CH); Philipp Sommer, Zürich (CH); Yannick Maret, Dättwil (CH)

(73) Assignee: HITACHI ENERGY SWITZERLAND AG, Baden (CH)

( * ) Notice: Subject to any disclaimer, the term of this patent is extended or adjusted under 35 U.S.C. 154(b) by 75 days.

This patent is subject to a terminal disclaimer.

(21) Appl. No.: 17/438,275

(22) PCT Filed: Mar. 11, 2019

(86) PCT No.: PCT/EP2019/056017
§ 371 (c)(1),
(2) Date: Sep. 10, 2021

(87) PCT Pub. No.: WO2020/182287
PCT Pub. Date: Sep. 17, 2020

(65) Prior Publication Data
US 2022/0149611 A1    May 12, 2022

(51) Int. Cl.
*H02H 3/00* (2006.01)
*H02H 3/16* (2006.01)
(Continued)

(52) U.S. Cl.
CPC ........... *H02H 3/16* (2013.01); *G01R 19/2513* (2013.01); *G01R 31/52* (2020.01); *H02H 1/0007* (2013.01); *H02H 9/005* (2013.01)

(58) Field of Classification Search
None
See application file for complete search history.

(56) References Cited

U.S. PATENT DOCUMENTS

| | | | |
|---|---|---|---|
| 3,443,223 A | 5/1969 | Kennon | |
| 4,577,148 A | 3/1986 | Sweetana | |

(Continued)

FOREIGN PATENT DOCUMENTS

| | | | |
|---|---|---|---|
| CN | 1892240 A | 1/2007 | |
| CN | 1991395 A | 7/2007 | |

(Continued)

OTHER PUBLICATIONS

Notice of Reasons for Refusal, Japanese Patent Application No. 2021-555007, dated Aug. 25, 2022, 4 pages.

(Continued)

*Primary Examiner* — Stephen W Jackson
(74) *Attorney, Agent, or Firm* — Sage Patent Group (57) ABSTRACT

Disclosed is a leakage current measuring device for a grid protection system protecting a power distribution or transmission grid from damage in case of a power surge, the grid protection system including a disconnector device and a surge arrester connected in series along a grounding path, the grounding path connecting a phase of a power distribution or transmission grid through the surge arrester and the disconnector device to ground, the disconnector device being configured for being activated in case of an overload condition, thereby disconnecting the surge arrester. The leakage current measuring device includes a leakage current sensor for measuring a leakage current $I_L$ flowing along the (Continued)

grounding path, the leakage current $I_L$ being indicative of the electrical connection status of the disconnector device. The electrical connection status is one of an activated and an inactivated status of the disconnector device.

19 Claims, 3 Drawing Sheets

(51) Int. Cl.
*G01R 31/52* (2020.01)
*G01R 19/25* (2006.01)
*H02H 1/00* (2006.01)
*H02H 9/00* (2006.01)

(56) References Cited

U.S. PATENT DOCUMENTS

| | | | |
|---|---|---|---|
| 11,588,318 B2 * | 2/2023 | Sommer | H02J 13/00002 |
| 2008/0068027 A1 * | 3/2008 | Crain | G01R 31/1236 |
| | | | 324/522 |
| 2012/0239321 A1 | 9/2012 | Normoyle et al. | |
| 2020/0303950 A1 * | 9/2020 | Roberts | H02J 13/00026 |

FOREIGN PATENT DOCUMENTS

| | | |
|---|---|---|
| CN | 202710690 U | 1/2013 |
| JP | S6323514 A | 1/1988 |
| JP | H0815345 A | 1/1996 |
| JP | 2007116879 A | 5/2007 |
| JP | 2008220024 A | 9/2008 |
| KR | 20110095983 A | 8/2011 |

OTHER PUBLICATIONS

International Search Report and Written Opinion of the International Searching Authority, PCT/EP2019/056017, dated Apr. 23, 2019, 15 pages.

* cited by examiner

LEAKAGE CURRENT BASED REMOTE MONITORING DEVICE AND METHOD FOR DISCONNECTOR DEVICES

CROSS REFERENCE TO RELATED APPLICATIONS

This application is a 35 U.S.C. § 371 national stage application of PCT International Application No. PCT/EP2019/056017 filed on Mar. 11, 2019, the disclosure and content of which is incorporated by reference herein in its entirety.

FIELD

The inventive concepts are in the field of monitoring devices in a power grid. In particular, the application discloses devices and methods for monitoring a disconnector device provided in a power distribution grid. The disconnector device can in particular be a disconnector such as a spark prevention unit for disconnecting a surge arrestor in case of an overload.

BACKGROUND

Surge arresters are used to protect a power grid or attached devices. These surge arresters can be considered as important protection devices in electrical network and protect expensive equipment, such as distribution transformers, against overvoltage surge by locally limiting a voltage. In some examples, they are installed in group of three on three-phase poles, especially poles that have a phase to ground connection.

The surge arrester can absorb a limited amount of energy and it may fail after a certain number of protection events and/or a certain overload (e.g. amount and/or duration of an overcurrent). The surge arrester may typically fail by thermal overload which means that the surge arrester may overheat and in extreme cases emit sparks and/or even explode.

To limit such a risk, disconnector devices have been developed, so-called spark prevention units (SPU), whose objective is to disconnect, in a spark-safe way, the surge arrester before a failure occurs. These disconnector devices may reduce the above-mentioned risk by disconnecting the surge arrester before thermal overload. Once disconnected, the surge arrester is removed from the electrical network. There may be a local visual indicator on the SPU that visualizes that the SPU has disconnected (tripped).

If a utility network, like a power grid or a power distribution network, comprises a large number of disconnector devices including SPUs (typically tens to hundreds of thousands), it becomes cumbersome to determine if the SPUs are still connected. Presently it may be required to send out a service crew that visually inspects each and every SPU. This is a time intensive task: a given SPU is thus inspected only once every year or even less often. A disconnected SPU could thus be in the network for a long period of time. That means, that in this location no protection against surge is available, since the surge arrester has been disconnected from the power grid. Analogous considerations also apply for other pole-mounted equipment.

To improve the situation, it is therefore desirable to provide devices and methods which may allow a more frequent and/or less cumbersome status monitoring of such protection devices.

SUMMARY

In order to address the foregoing and other potential problems, embodiments of the present disclosure may propose several ways to overcome above mentioned drawbacks.

Therefore, in a first aspect, a leakage current measuring device for a grid protection system, protecting a power distribution or transmission grid from damage, in case of a power surge, is provided.

The grid protection system may include a disconnector device and a surge arrester, connected in series along a grounding path. The grounding path may connect a phase of a power distribution or transmission grid through the surge arrester and the disconnector device to ground. The disconnector device may be configured for being activated in case of an overload condition, thereby disconnecting the surge arrester. The leakage current measuring device comprises a leakage current sensor for measuring a leakage current $I_L$, flowing along the grounding path. The leakage current $I_L$ is indicative of the electrical connection status of the disconnector device, the electrical connection status being one of an activated (open, disconnected), and an inactivated (closed, connected) status of the disconnector device.

In a further aspect, an electrical connection status determining unit, configured to be connected to the leakage current measuring device according to other aspects of the present disclosure is provided. The electrical connection status determining unit comprises an input section, configured to receive, from the leakage current measuring device, leakage current data indicative of the leakage current $I_L$, and a determining section. The determining section is configured to determine the electrical connection status of the disconnector device from the leakage current data.

In yet a further aspect, an electrical connection status monitoring system is provided. The monitoring system comprises the electrical connection status determining unit according to aspects of the present disclosure and may further comprise the leakage current measuring device of other aspects of the present disclosure. The electrical connection status determining unit may be connected to the leakage current measuring device which is configured to receive the leakage current data from the leakage current measuring device.

In a further aspect, a protection disconnector system for protecting a surge arrester in a power distribution or transmission grid is provided. The protection disconnector system comprises: a disconnector device, being connectable to the surge arrester and being configured for being activated in case of an overload condition, and configured to thereby disconnect the surge arrester. The protection disconnector system further comprises the electrical connection status monitoring system according other aspects of the present disclosure, the leakage current measuring device being operatively connected to the grounding path for measuring the leakage current $I_L$ flowing along the grounding path.

In a further aspect, a grid protection system for protecting a power distribution or transmission grid from damage in case of a power surge is provided.

The grid protection system comprises the protection disconnector system according to other aspects of the present disclosure and a surge arrester. The disconnector device and the surge arrester may be connected in series along the grounding path, the grounding path connecting the phase of the power distribution or transmission grid through the surge arrester and the disconnector device to ground. The leakage current sensor is configured for measuring the leakage current $I_L$ flowing along the grounding path.

In a further aspect, a method for monitoring an electrical connection status of a disconnector device of a grid protection system is provided.

The method may protect a power distribution or transmission grid from damage in case of a power surge; the grid protection system includes the disconnector device and a surge arrester connected in series along a grounding path, the grounding path connecting a phase of a power distribution or transmission grid through the surge arrester and the disconnector device to ground. The disconnector device is configured for being activated in case of an overload condition, thereby adapted to disconnect the surge arrester.

The method comprises to measure a leakage current $I_L$, flowing along the grounding path, with a leakage current sensor; to determine, based on the measured leakage current $I_L$, an electrical connection status of the disconnector device (110). The electrical connection status may be one of an activated and an inactivated status of the disconnector device (110).

BRIEF DESCRIPTION OF DRAWINGS

Embodiments of the present disclosure will be presented in the sense of examples and their advantages are explained in greater detail below, with reference to the accompanying drawings, wherein.

DETAILED DESCRIPTION OF DRAWINGS AND EMBODIMENTS

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter.

Figure 1:
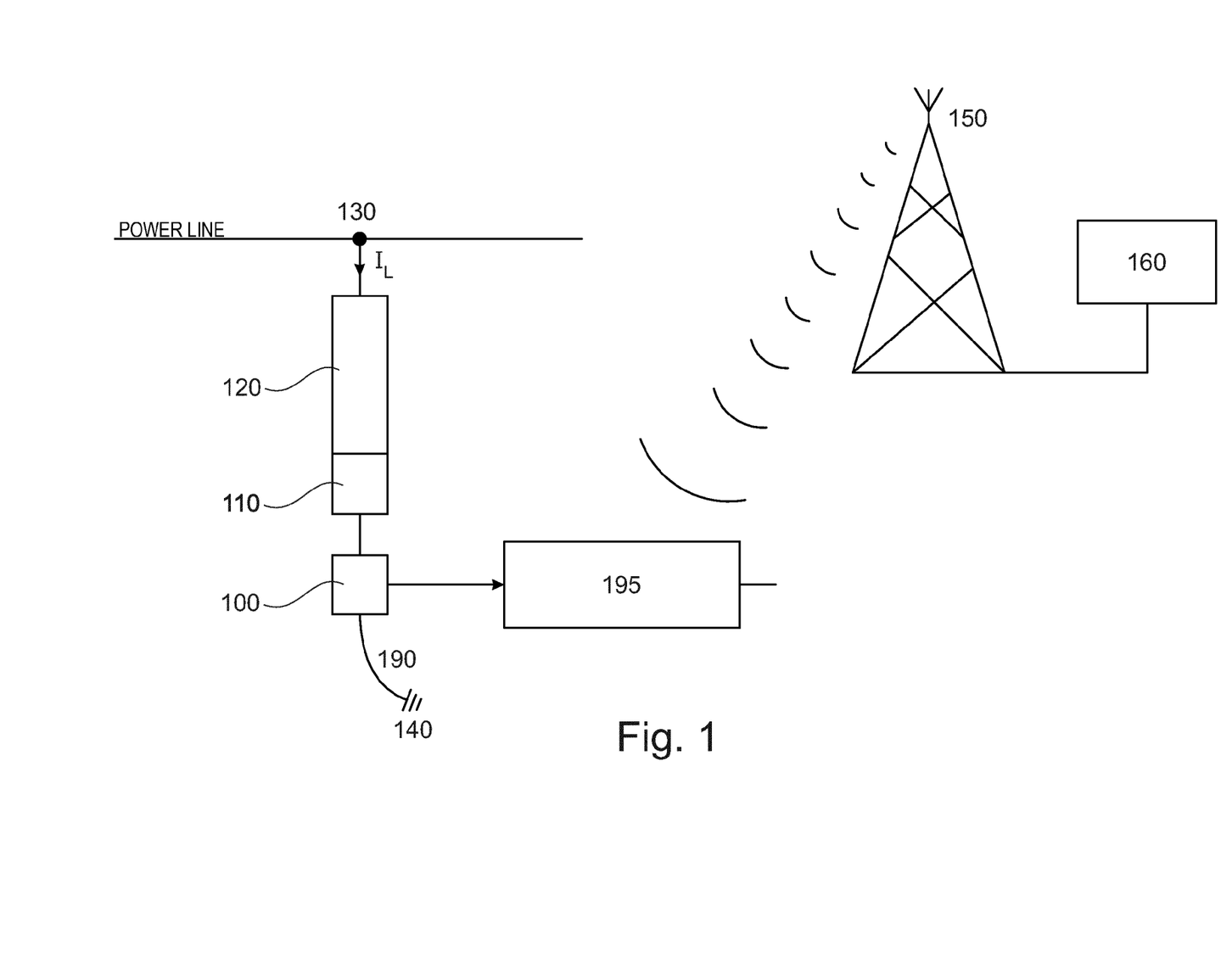
FIG. 1 schematically shows an aspect according to embodiments of the present disclosure.

FIG. 1 schematically shows an exemplary embodiment of the present disclosure for a power line of a power grid, having a phase 130. The power grid and/or a surge arrester 120 may be rated for high voltage, i.e., at least 1 kV, preferably more than 10 kV rated RMS voltage.

The surge arrester 120 electrically connects with one side to phase 130 of the power line. A disconnector device 110, preferably an SPU, is electrically connected to a second side of the surge arrester 120.

The disconnector device, with another side, is connected to ground 140 with a grounding cable 190. More generally, the surge arrester 120 and the disconnector device 110 are connected in series along a grounding path connecting the phase 130 to ground 140. The disconnector device 110 is configured for being activated in case of an overload condition, thereby disconnecting the surge arrester 120, as discussed in the technical background section above.

During normal operation of the components shown in FIG. 1, a rated power is applied to the phase 130, the surge arrester 120 is operating normally, and the disconnector device 110 is in an inactivated state (i.e., has not disconnected, not tripped). In this mode of normal operation, a leakage current $I_L$ flows through the surge arrester 120 due to the large potential difference between the phase 130 potential and ground. The leakage current flows along the grounding path between the phase 130 of the power line and ground 140, thereby flowing through the surge arrester 120 and the disconnector device 110. On the other hand, if the disconnector has been activated (has disconnected, tripped), thereby disconnecting the ground path, the leakage current through the grounding cable 190 drops nominally to zero. Therefore, the leakage current along the grounding path indicates a possible disconnection of the surge arrester 120 by the disconnector device 110, and thus information about the leakage current enables to determine the electrical connection status (activated or inactivated) of the disconnector.

A leakage current measuring device 100 with a leakage current sensor is operatively connected to the grounding path (here: grounding cable 190) for measuring the above-described leakage current flowing along the grounding path. In the embodiment of FIG. 1, the leakage current measuring device 100 is arranged between the disconnector 110 and ground 140. The leakage current measuring device 100 is connected to an electrical connection status determining unit 195. The leakage current measuring device 100 is configured to output leakage current data indicative of the leakage current $I_L$ to the connection status determining unit 195; and the connection status determining unit 195 is configured to determine the electrical connection status from the leakage current $I_L$.

The status determining unit 195 may determine a status of the disconnector device 110 from leakage current $I_L$ as follows: If the disconnector is inactivated (connected), a leakage current will flow indicating a possibly inactivated status of the disconnector. On the other hand, if the disconnector 110 is activated (trip), the leakage current through the grounding cable 190 drops nominally to zero, thus indicating a possibly activated status of the disconnector 110.

Thus, in an embodiment, the connection status determining unit 195 may determine the connection status of the disconnector device 110 as follows: In case the leakage current measurement indicates a nominally nonzero leakage current through the disconnector device 110, the connection status may be determined as inactivated; and in case the leakage current measurement indicates a nominally zero leakage current through the disconnector device 110, the connection status may be determined as activated.

A nominally zero leakage current is not necessarily mean that the disconnector has been activated, but may have other causes. For example, the leakage current is also zero in case of a non-energized power line (no voltage at the phase of the power line 130). On the other hand, a nonzero leakage current reliably indicates an inactivated (non-tripped) state of the disconnector. Therefore, even if other causes for zero leakage current are not taken into account, the above-described determining function has the advantage of possibly erring on the safe side but not on the unsafe side: There may sometimes be a false indication of an activated state of the disconnector (nonzero leakage current through the surge arrester), i.e. of a potentially dangerous state, even if the disconnector is in reality inactivated, resulting in a false alarm. But, if the determining function indicates an inactivated state of the disconnector, i.e., the expected normal state, there is no risk of a mischaracterization, i.e., no risk of a false sense of safety. In other words, a potentially dangerous state is reliably reported.

The above-mentioned connection status determining unit 195 may receive further information allowing to reduce the rate of falsely indicated activated states. In particular, connection status determining unit 195 may receive grid status data indicative of whether the phase of the power line 130 carries a voltage or not. A state in which a voltage is present is also referred to an active grid status, and a state in which no voltage is present is also referred to as an inactive grid status. The connection status determining unit 195 may receive and take into account the grid status when determining the electrical connection status of the disconnector device. In particular, the connection status determining unit 195 may determine an activated state of the disconnector only in case of an active grid status. Thereby, the above-mentioned false alarms can be eliminated or reduced.

While this method may in some cases result in a temporarily undetected activated state of the disconnector, this does not result in a large risk because this situation only arises in cases in which the grid is inactive anyway. As soon as the grid is active, any activated disconnector will be detected.

The electrical connection status determining unit 195 may transmit a status of the disconnector device 110 to central unit 160. In FIG. 1, this transmission is shown, by means of example, through a wireless infrastructure 150. Central unit 160 may serve as a central grid control, where information of a multitude of disconnector devices are collected and processed and optionally displayed on a map or a display to enable service personnel to find "tripped" or defective disconnector devices 110.

The electrical connection status determining unit 195 is shown here, in non-limiting form, as a separate unit for a better explanation. The leakage current measuring device 100 may in other embodiments contain the electrical connection status determining unit 195 in a single housing and/or with a common energy supply.

Further variations are possible. For example, the connection status determining unit 195 may be provided at a remote location (remote from the leakage current measuring device 100, e.g., not pole-mounted but located at a distance from the pole and possibly at a distance of more than 10 m or more than 100 m away from the pole). The connection status determining unit 195 may in this case receive the leakage current data from the leakage current measuring device 100 over a communication channel for remote communication (e.g., over a cable-based or wireless communication infrastructure). The connection status determining unit 195 may in this case also be provided with the central unit 160, possibly as part of a (possibly distributed) monitoring and/or control system.

Figure 2:
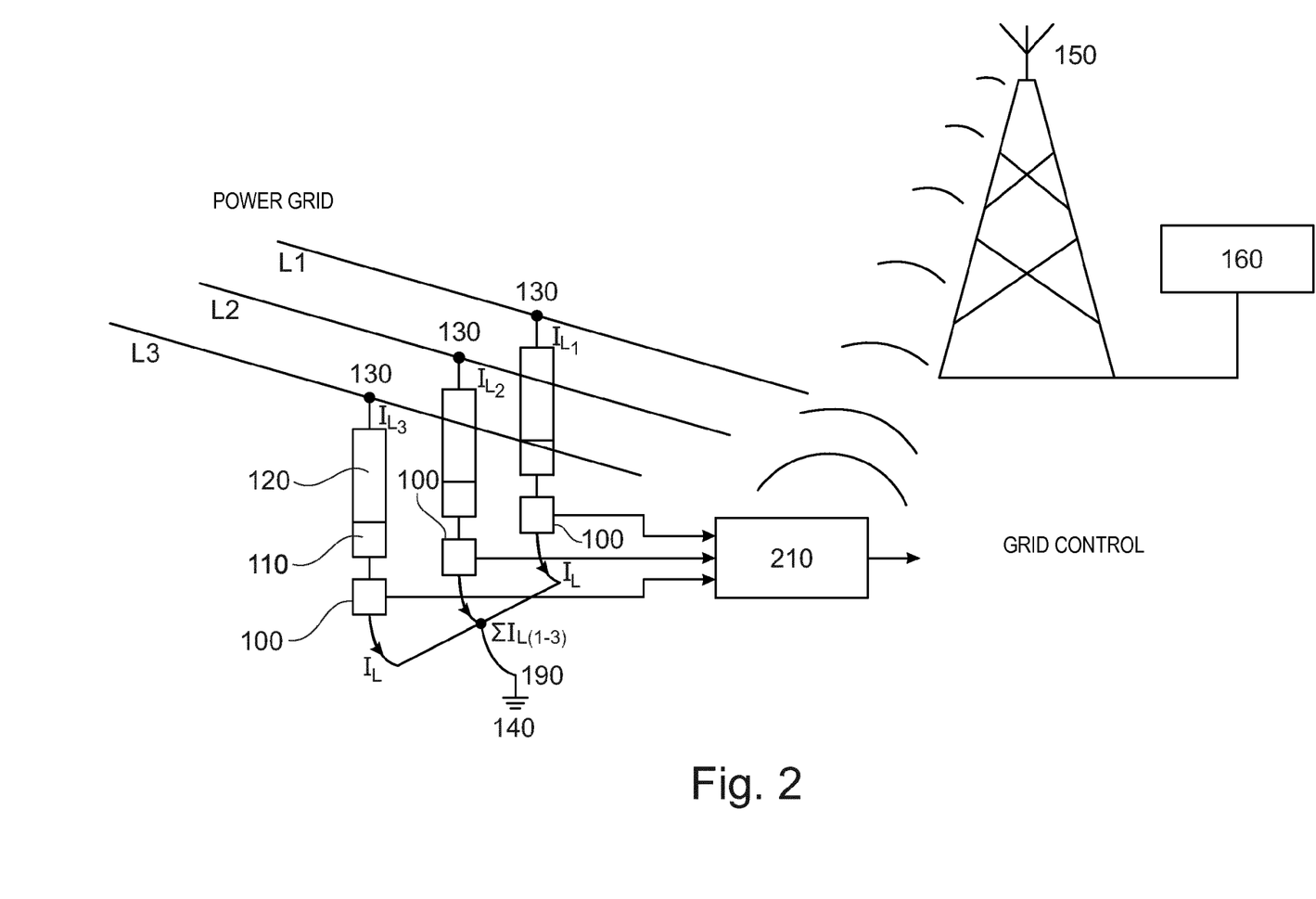
FIG. 2 schematically shows another aspect according to embodiments of the present disclosure.

FIG. 2 shows a further embodiment of the present disclosure with a three-phase power grid. As evident from FIG. 2, each phase is equipped with a leakage current measuring device 100, in other words, each leakage current in each phase is measured with its own leakage current sensor.

The leakage current measuring devices 100 are connected by wire to a multi-channel electrical connection status determining unit 210. This connection status determining unit 210 may process and analyse all three currents to detect any disconnector device 110 which has disconnected. For all further details, the above description of the connection status determining unit 195 of FIG. 1 applies to the connection status determining unit 210 of FIG. 2 as well.

Figure 3:
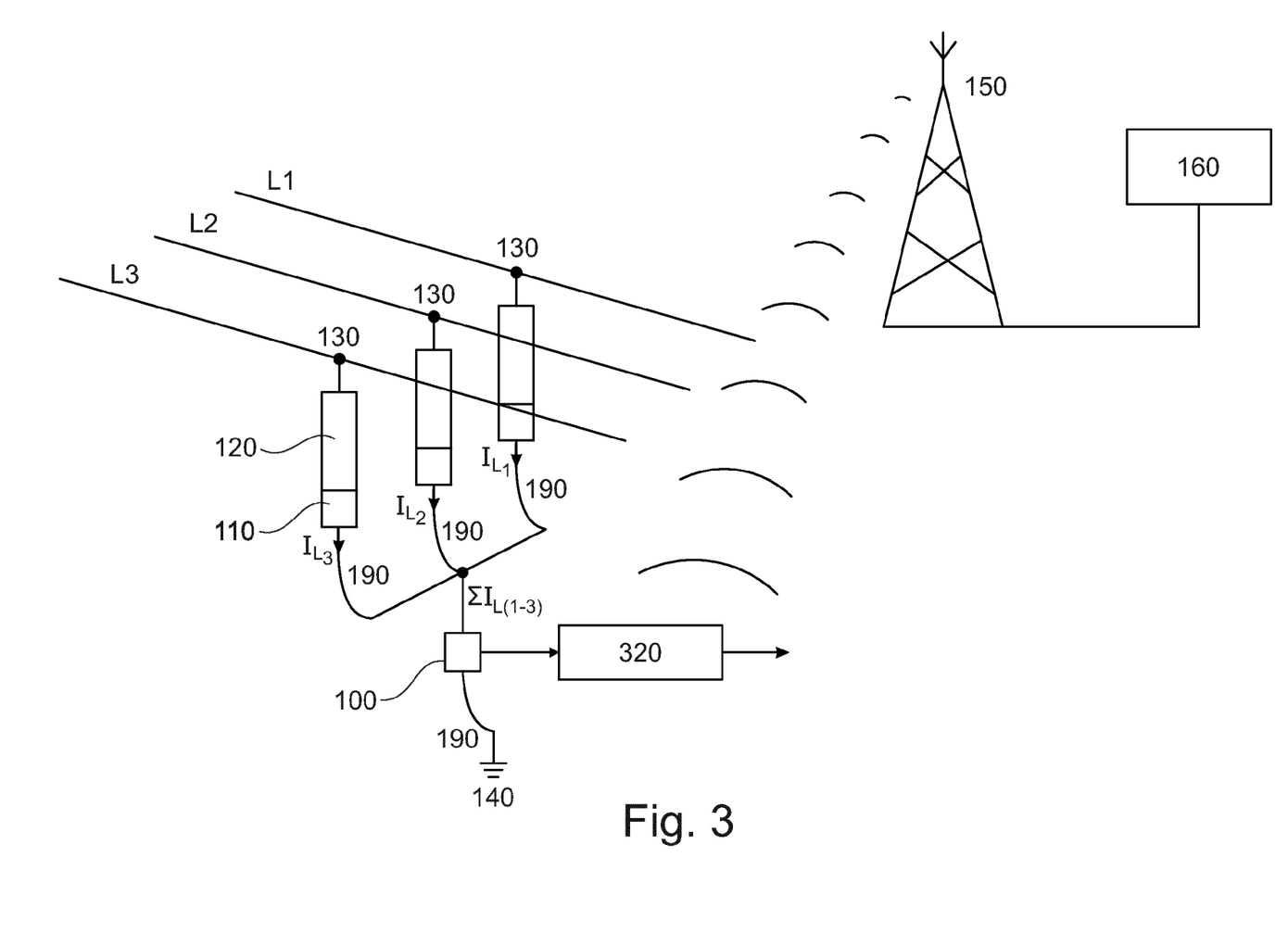
FIG. 3 schematically shows another aspect according to embodiments of the present disclosure.

FIG. 3 shows, a further embodiment. In the embodiment of FIG. 3, a single leakage current detection unit 100 (with a single leakage current sensor) is used to measure the combined leakage current through three grounding paths at the same time. The three grounding paths are connected in parallel, via a sum point, to a single section of a ground cable 190. The leakage current measuring device 100, is arranged on the ground cable 190 behind a sum point, in which the three currents $I_{L1}+I_{L2}+I_{L3}$ are combined (superimposed), so that the leakage current measuring device 100 measures the combined leakage currents through all three grounding paths at the same time.

The leakage current measuring device is connected to an electrical connection status determining unit 320.

This connection status determining unit 320 is configured, to determine, from the total leakage current $I_L$ ($I_L$ being the sum current $I_{L1}+I_{L2}+I_{L3}$, of the individual leakage currents) if any of the disconnector devices (SPU) 110 has disconnected (has been activated).

This is possible because the measured total leakage current $I_L$ is also indicative of a leakage current component through each of the disconnector devices 110 (of the connection status of each of the disconnector devices 110): If all three disconnector devices 110 are inactivated, a leakage current component of similar magnitude is expected to flow along all grounding paths. In this case, due to their different phases the leakage current components are expected to cancel out each other approximately, resulting in a near-zero total leakage current. On the other hand, if one or two of the disconnector devices 110 are inactivated but the remaining one(s) is/are activated, the leakage current components no longer cancel out each other, resulting in a larger leakage current. Finally, if all three disconnector devices 110 are activated, an exactly zero total leakage current is expected.

Since the phases 130 may be unbalanced and the leakage current behaviour through 120, 110 has a certain spread due to deviations in the internal resistance or from manufacturing, the sum of the current may not be zero (even if all surge arresters are still connected) as can be expected in a (theoretically) fully balanced grid. Also, small imbalances between the three grounding paths may be deliberately introduced in order to be able to distinguish different fault scenarios as explained below.

In this case, the connection status determining unit 320 may be configured to distinguish these three cases and determine a partially activated status of the disconnector devices 110 if the measured leakage current is above a first, larger threshold; an inactivated status of the disconnector devices 110 if the measured leakage current is below the first threshold but above a second, smaller threshold; and a fully activated status of the disconnector devices 110 if the measured leakage current is below the second threshold. There may also be other conditions for distinguishing these three cases, e.g., by also considering phase shifts of the voltages applied to the power grid phases with respect to each other.

Thus, the detection of the disconnection of a surge arrester 120 can be based on analysing the evolution of the sum of the leakage current. For example, a sudden increase in leakage current can be interpreted such that one of the surge arrester has been disconnected.

The above information may, again, be combined with other information as e.g. a voltage over one or more of the phases 130. This combination may allow distinguishing the case of a fully activated status of the disconnector devices 110 from the case of an inactive grid, in analogy to the description of FIG. 1 above.

With these modifications, the above description of the electrical connection status determining unit 195 of FIG. 1 also applies to the electrical connection status determining unit 320 of FIG. 3.

DETAILED DESCRIPTION OF FURTHER EMBODIMENTS AND ASPECTS

Hereinafter, further aspects, details and illustrative embodiments of the disclosure are described. It should be understood, all these embodiments are given merely for the skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification. It will of course be appreciated that in the development of any such actual embodiment, numerous implementation-specific decisions should be made to achieve the developers' specific goals. Here, reference signs refer jointly to the Figures described above, but are merely meant as illustration but not as limiting the description to the embodiments shown in these Figures.

The proposed solution, which will be outlined in the following, may disclose a method to remotely check a state of disconnector devices 110, in particular an SPU (Spark Prevention Unit) such as a fuse element. The method may be based on monitoring a leakage current from a phase 130, through a surge arrester and its ground 140 connection.

By combining the current measurement with additional system information (i.e. voltage status on the power line, respectively on the phase 130) it may be determinable, if the disconnector device 110 has disconnected said phase 130 to ground 140 connection. In other words, it may be determinable, if the SPU has "tripped".

In an embodiment of the present disclosure, a leakage current measuring device 100 for a grid protection system may be disclosed. The grid protection system may protect a power distribution or transmission grid from damage in case of a power surge.

The grid protection system may include a disconnector device 110 and a surge arrester 120, connected in series along a (i.e., at least one) grounding path 190. The grounding path connecting a phase 130 of the power distribution or transmission grid through the surge arrester 120 and the disconnector device 110 to ground 140.

The surge arrester may be provided for mounting on a pole of the power distribution or transmission grid. The power distribution or transmission grid and/or the surge arrester can be rated for high voltage, at least >1 kV.

The disconnector device 110 may be configured for being activated in case of an overload condition. The overload condition may occur at the disconnector device 110. The activated disconnector device 110 thereby disconnecting the surge arrester 120 e.g. from the grid or from ground.

The disconnector device 110 may be arranged on a ground side of the surge arrester, i.e. in the grounding path between the surge arrester and ground (in series with the surge arrester)

The leakage current measuring device 100 may comprise a leakage current sensor for measuring a leakage current $I_L$ flowing along the grounding path. The term "leakage current $I_L$" may include a leakage current component flowing through the grounding path, in particular a component of a superposition of several phases. The leakage current $I_L$ may be indicative of the electrical connection status of the disconnector device 110, the electrical connection status being one of an activated and an inactivated status of the disconnector device 110. Typical values of the leakage current of metal-oxide surge arrester for medium-voltage application may be in a range between fractions of mA to few mA.

The leakage current may be a natural leakage current to ground which flows through any surge arresters under normal operating conditions.

The leakage current measuring device 100 may be adapted to be connected to a ground cable 190 of the at least one disconnector device 110 (see FIGS. 1 to 3). The leakage current measuring device 100 may optionally have a clamp-on section for clamping onto the disconnector device 110 and/or onto a grounding connection, connecting the disconnector device 110 to ground.

The term "indicative" means, at least when taken in combination with other information such as an activation status of the phase of the grid. The term "activated status" means that the disconnector device 110 has been activated and is in a disconnected state. The term "inactivated status" means, that disconnector device 110 has not been activated, which means it is in a connected state. The "activated" status and the "inactivated" status may be interpreted in particular, when taken together with other information, e.g. with information that the phase of the power distribution or transmission grid is in an active state, or in other words that the phase or the phases carry an operating voltage.

The leakage current sensor can for example be based on one or more of the following technologies. Other suitable sensing technologies are not excluded.

A current transformer—consisting of a magnetic core, a primary winding given by the same ground cable 190 passing through the magnetic core, and a secondary winding to which a processing unit analog front-end is connected.

A Rogowski coil—which, with respect to current transformers, has the advantage of not requiring a ferromagnetic core and of being open-ended (i.e. easily allowing a clamp-on design for retrofit) and being of smaller size.

A shunt resistor—i.e. a low-resistive conductor of known impedance, in series to the earth cable, across which the voltage could be measured to derive the current through it.

A magnetic sensor array—an array of semiconductor sensors (e.g. Hall sensor, AMR/GMR sensors) to derive the integral of the magnetic field on a closed path around the earth connection. Due to Ampere's law, this integral corresponds to the leakage current flowing through the earth cable.

Split-core transformers or flexible Rogowski coils may provide a clamp-on retrofit solution for the leakage current sensors and therefore also for the leakage current measuring device 100.

According to the sensing technology, leakage current sensor may be a pure passive device (as in the case of transformers, coils and resistors), or may optionally comprise active circuitry, to immediately process information from the sensing elements (as in the case of the magnetic sensor array)

Optionally, the leakage current sensors may be autonomous modules. This means, the leakage current sensors may have integrated detection and processing circuitry, as e.g. System-on-Chip (SoC) systems.

A first detected leakage current range (e.g., indicating a leakage current component through the disconnector above a given threshold) is indicative of an inactivated status of the disconnector device; a second detected leakage current range (e.g., indicating no leakage current component above the given threshold through the disconnector) is indicative of an activated status of the disconnector device. In other embodiments, the measured leakage current may essentially be the same as the leakage current component through the disconnector (i.e., without significant other superimposed currents).

Alternatively, the step of "measuring a leakage current $I_L$ flowing along the grounding path" may also include a measurement of a superimposed current, in which other currents are superimposed on the leakage current component through the disconnector.

The following consideration may serve as a non-limiting, example:

A sum $I_{L1}+I_{L2}+I_{L3}$ of several leakage currents flowing along several grounding paths, in particular the grounding paths of the phases L1, L2, L3 in a three-phase system as shown in FIGS. 2 and 3, may merge in a "sum"-point, before the leakage current sensor, as shown in FIG. 3, measures a sum of $I_{L1}+I_{L2}+I_{L3}$.

This shall also be considered as a measurement of a leakage current, including any one of the leakage current components $I_{L1}$, $I_{L2}$, $I_{L3}$ flowing along each of the grounding paths.

In this case, under normal operation with inactive disconnectors, the leakage current components $I_{L1}$, $I_{L2}$, $I_{L3}$ (in a balanced system) cancel out, so that the measured leakage current is low (below a predetermined threshold). Thus, a first (low) measured leakage current may be indicating a leakage current component through the disconnector, and therefore be indicative of an inactivated status of the disconnector device.

On the other hand, if one or two of the disconnectors is activated, the total measured leakage current is no longer cancelled out, and is therefore no longer below the predetermined threshold. A second (larger) detected leakage current may thus be indicating that no leakage current component flows through one of the disconnectors (but through at least a subset of other disconnectors), i.e., be indicative of an activated status of the disconnector device.

An overload condition in the sense of the present disclosure may be defined in terms of magnitude, duration, or combination of both, of the current or power, flowing through the disconnector device 110. An overload condition may therefore be an overcurrent through the disconnector device 110, such as a current exceeding an overcurrent threshold for the magnitude and optionally for the duration of the overcurrent, or any other condition indicating a risk of thermal overload.

The disconnector may be activated by overcurrent through the disconnector device 110 over a certain time. A material within the disconnector device 110 may heat up over the time, caused by the overcurrent, and may melt in an instant or may be ignited, thereby interrupting a connection.

An example for such a disconnector device may be a consumable fuse element, adapted to change from an unconsumed state to a consumed state in an operating state of the disconnector device 110. The connection status monitoring device 100 may be adapted for determining, whether the fuse element has blown, i.e., whether the fuse element has been activated.

The leakage current measuring device 100 can also be regarded as a disconnector status monitoring device.

The leakage current measuring device 100 may further comprise a position detection system, adapted to detect a position of the leakage current measuring device 100. The position detection system may include, e.g., a satellite-based positioning system for obtaining a geographic location, a positioning portion configured for obtaining position information through interaction with a communication infrastructure 150, and/or a reading device for reading position information available from equipment of the power distribution or transmission grid. The leakage current measuring device 100 can be adapted to transmit a position data indicative of the detected position to the communication infrastructure 150.

The geographic location may be an absolute position, e.g., given in coordinates, like longitude and latitude values or may be a relative position, e.g., a distance from a gateway of the communication infrastructure 150, from a neighbouring connection status monitoring unit 192, 210, 310 or the like. The geographic position may be any information allowing to determine the position of the device, e.g., on a map. Examples of such a geographic position may be a pole identifier (number) or a line position.

The communication infrastructure 150 may be connected to a data network, such as to a global data network. The data network may be an Ethernet network using TCP/IP such as LAN, WAN or Internet.

The leakage current measuring device 100 may be further adapted to determine further data, indicative of at least one selected from a status, an event (e.g., a status and/or an event of the disconnector device 110, the surge arrester, the power distribution or transmission grid and/or the communication infrastructure.

The status may be an energy supply status; a health status; an operating state. The event may be a change in status, e.g. a change in a battery charging condition. The leakage current measuring device 100 may be adapted to transmit the further data over the communication infrastructure 150 and also to central unit 160.

The leakage current measuring device 100 may further be adapted to perform a self-diagnosis. Any results of the diagnosis e.g. stating a failure in the leakage current measuring device 100 may also be considered as an event.

Another embodiment may disclose that the leakage current measuring device 100 according to one or more embodiments of the present disclosure may further comprise an output section, adapted to output leakage current data. The output leakage current data may be indicative of the leakage current $I_L$ to a determining section, wherein the determining section is configured to determine the electrical connection status from the leakage current $I_L$.

Output leakage current data may contain information of e.g., magnitude of the leakage current, or any other information obtained from the leakage current and containing at least a partial information about the leakage current $I_L$.

In an embodiment of the present disclosure, the determining section may be integrated with the leakage current measuring device 100 into a single unit or maybe provided as part of another unit such as a central unit 160. The output section may be a simple data output (hard- and/or software) or may comprise a communication section for transmitting the leakage current data over a distance. The central unit 160 may comprise distributed storage units such as a Cloud. Depending on the application, the Cloud can be in form of public, private, hybrid or community Cloud.

The communication section may employ several wireless protocols like e.g. LoRa WAN, SigFox, LTE, GSM. This listing is not to be considered as limiting. Any protocol, available now and in future, which is capable of fulfilling the objective of transmitting the leakage current data and the further data over a distance, is enclosed herewith.

In particular, data protocols are disclosed, which are specifically designed for IoT-applications, since the protocols are designed to transmit information with as less energy as possible, since IoT devices generally may have a very limited, in-built energy source.

The communication section may have a maximum transmission power, and maybe configured to transmit its data (status data, connection data, events or else data, disclosed in the current application) over the wireless communication infrastructure 150 using an actual transmission power being only a (selectable) fraction of the maximum transmission power.

The actual transmission power may be selected to be higher than a lower threshold defined for a guaranteed successful transmission over the wireless communication infrastructure 150. The actual transmission power may be selected to be lower than an upper threshold defined for the connection status monitoring device to reach a predetermined lifetime of a power supply such as a battery.

A battery lifetime between 1 and 20 years with one transmission per day may be assumed. Battery usage per transmission may be between a lower limit of 0.1‰ (permille) of the nominal battery energy content and an upper limit of 3‰ (permille) of the nominal battery energy content. The communication section is adapted to transmit the connection status indicator data with a transmission energy use of at least 1 µWh and/or at most 1 mWh per transmission.

The communication section may optionally be adapted to transmit the leakage current data, the further data and/or the position data in one or more output data package(s). The communication section may further be adapted to transmit said data a) in predetermined time intervals, in particular at least once a day and at most once an hour, b) upon an event, c) upon a change in status, or d) any combination of a-c.

The leakage current measuring device 100 may be adapted to transmit the position data to the communication infrastructure when the leakage current measuring device 100 is activated the first time or after a maintenance.

Another embodiment of the present disclosure may disclose that the leakage current measuring device 100 according to one or more embodiments of the present disclosure, may further comprise the determining section and that the determining section being configured to determine, from the leakage current data, the electrical connection status of the disconnector device 110.

A embodiment of the present disclosure may disclose that the leakage current measuring device 100, according to one or more embodiments of the present disclosure, may further comprise an energy supply. The energy supply may be provided in form of a battery or may be an energy harvesting system, in particular an energy harvesting system with a circuit arrangement which is configured for harvesting energy from the leakage current, flowing along the grounding path.

The energy supply may allow the leakage current measuring device 100 to operate independently from an external power supply or a power net. The energy supply may be a rechargeable energy supply. The energy harvesting system may serve to recharge the rechargeable energy supply. The energy harvesting system may also be configured to power the leakage current measuring device 100 without a specific battery, e.g. by powering a capacitor (super-cap). The energy harvesting system may in particular also be provided as one or more photovoltaic cells, alternatively to said circuit arrangement for harvesting energy from a current flowing along the grounding path.

In an embodiment of the present disclosure, a leakage current measuring device 100 according one or more embodiments is disclosed. The leakage current measuring device 100 may further be configured to measure a voltage along the grounding path, in particular across the surge arrestor or the disconnector.

This is e.g. a voltage measured across the disconnector device 100. The leakage current measuring device 100 and/or the determining section are configured to perform a plausibility check of the leakage current $I_L$ with the measured voltage. This is because the leakage current sensor may have a "null" output also in case the power line is de-energized. This may cause an ambiguity which can be resolved either by monitoring locally the power line voltage, or by comparing the measurements among different phases at the same location, or by later combining the information (e.g. at power grid level) where the power line status is known.

An algorithm to detect the status of the disconnector device 110 (a "tripped SPU") can be a threshold-based method (according to the nominal leakage current of the surge arrester) or could include some adaptive features to learn from an actual leakage current of the installed device.

Another embodiment may disclose an electrical connection status determining unit 195, 210, 320, configured to be connected to the leakage current measuring device 100 according to other embodiments of the present disclosure. The electrical connection status determining unit 195, 210, 320 may comprise an input section, configured to receive leakage current data from the leakage current measuring device 100. The leakage current data indicative of the leakage current $I_L$. The electrical connection status determining unit may further comprise a determining section, which may be configured being configured to determine the electrical connection status of the disconnector device 110, from the leakage current data.

According to another embodiment, the electrical connection status determining unit 195, 210, 320 according one or more embodiments, may disclose that the input section is further configured to receive grid status data indicative of a grid status of the power distribution or transmission grid. This may be e.g. status data of the phase (130) of the power distribution or transmission grid. Such information may be provided by a substation or power grid, Supervisory Control and Data Acquisition, SCADA, system, such as an Energy Management System, EMS, or a Distribution Management System, DMS.

The grid status being one of active state and inactive state. Active state may mean that one or all phases in the grid being energized, thereby carrying an operating voltage. Inactive state may mean that the phases are not energised and not carrying operating voltage.

The determining section in the electrical connection status determining unit 195, 210, 320 may further be configured to determine, from the leakage current data and the grid status data, the electrical connection status of the disconnector device 110.

In another embodiment of the present disclosure, it may be disclosed, that the electrical connection status determining unit 195, 210, 320 according to other embodiments, may further comprise at least one of a) a grid voltage or current measurement device for measuring the grid voltage or current, and for transmitting the grid voltage or current as the grid status data to the input section.

b) a grid-system data connection to a grid monitoring system, the input section being configured to receive, from the grid monitoring system, the grid status data over the data connection.

c) a leakage-current data connection to a further leakage current measuring device, wherein the input section is configured to receive, from the further leakage current measuring device, further leakage current data over the leakage-current data connection.

The further leakage current data may be indicative of at least one further leakage current ($I_{L2}$) flowing along at least one further grounding path. A grounding path may connect the same phase or a further phase of the power distribution or transmission grid through a further surge arrester (120) to ground 140. The further leakage current data may be comprised in the grid status data.

In other words, the determining section is configured to determine the grid status, from the further leakage current data, in particular, the determining section may be configured to determine that the grid status is an active status under the condition that at least a subset of the further leakage current data indicates a leakage current, e.g., above a predetermined threshold.

Another embodiment of the present disclosure may disclose the electrical connection status determining unit 195, 210, 320 according one or more embodiments, wherein the determining section may be configured to determine, if the electrical connection status of the disconnector device 110 is an inactivated status under the condition that the leakage current data indicates a leakage current component through the disconnector device 110, e.g. determine if the measured leakage current is above a predetermined threshold, and wherein the determining section is configured to determine, that the electrical connection status of the disconnector device 110 is an activated status under the condition that the leakage current data indicates a zero or near zero (low) leakage current component through the disconnector device 110 and that the grid status data is indicative of an active grid status of the power distribution or transmission grid (e.g. an active phase with an operating voltage). The term low in this context means, below a predetermined threshold.

Another embodiment may disclose an electrical connection status monitoring system. The electrical connection status monitoring system may comprise the electrical connection status determining unit 195, 210, 320 according to embodiments of the present disclosure, and the leakage current measuring device 100 according to embodiments of the present disclosure.

The electrical connection status determining unit 195, 210, 320 may be connected to the leakage current measuring device 100 for receiving the leakage current data from the leakage current measuring device 100.

Another embodiment discloses the electrical connection status monitoring system according one or more embodiments of the present disclosure, wherein at least the leakage current measuring device 100 and the electrical connection status determining unit are provided as an integrated unit with a common housing. In a further embodiment, a common energy supply may be provided in the common housing.

In another embodiment, the electrical connection status monitoring system according to one or more embodiments discloses, that the electrical connection status determining unit 195, 210, 320 may be located remotely from the leakage current measuring device.

In other words, the electrical connection status determining unit 159, 210, 320 may not be mounted to the pole, but possibly in a central unit 160, wherein the central unit 160 may be a distributed unit and/or a cloud. The electrical connection status determining unit 195, 210, 320 may further be connected to the leakage current measuring device via a data line and/or data network. The data line or the data network may connect over a distance >100 m.

In another embodiment of the present disclosure, the electrical connection status monitoring system according one or more embodiments of the present disclosure, may comprise a plurality of leakage current measuring devices 100 with a respective leakage current measuring device 100 provided for each phase (L1, L2, L3) of the power distribution or transmission grid. I.e. mounted at the same pole of the power distribution or transmission grid.

In another embodiment of the electrical connection status monitoring system according one or more embodiments of the present disclosure, the grounding paths for at least two, or all, of the phases of the power distribution or transmission grid, may merge into a common grounding path section as shown in FIG. 3. The leakage current measuring device 100 may further be arranged for measuring the leakage current flowing through the common grounding path 190 section.

The leakage current measuring device 100 may optionally employ a phase filter for separating the contributions of the respective leakage currents of the surge arresters to the total measured leakage current from each other.

A further embodiment may provide a protection disconnector system for protecting a surge arrester in a power distribution or transmission grid.

The protection disconnector system comprising a disconnector device 110, being connectable to the surge arrester 120 and being configured for being activated in case of an overload condition, thereby disconnecting the surge arrester (120). In other words, the surge arrester 120 may be disconnected from the grid or from ground.

The protection disconnector system may further comprise the electrical connection status monitoring system according to other embodiments, the leakage current measuring device 100 being operatively connected to the grounding path for measuring the leakage current $I_L$ flowing along the grounding path. Of course, the leakage current also flows through the disconnector device 110.

Optionally, the leakage current measuring device 100 may operatively be connected to the disconnector device 110. The disconnector device may comprise a consumable fuse element adapted to change, upon activation, from an unconsumed state (=inactivated status) to a consumed state (=activated status).

Another embodiment of the protection disconnector system according to other embodiments, may disclose, that the disconnector device 110 may be adapted to be activated for disconnecting the surge arrester 120, e.g. disconnecting the surge arrester from the power distribution or transmission grid or from ground, in case of an overload condition.

An overload condition may be an overcurrent through the grounding line, (in particular through the disconnector device 110 device), e.g., the current through the disconnector device exceeding an overcurrent threshold in terms of magnitude, duration, or combination of both, of the current or power.

An example for such a disconnector device 110 device may be a consumable fuse element. Such a fuse element may be adapted to change from an unconsumed state to a consumed state in an operating state of the disconnector device 110, such as an explosive fuse or a fuse having a conductor element that melts upon experiencing an overcurrent.

In another embodiment, a grid protection system for protecting a power distribution or transmission grid from damage in case of a power surge may be provided. The grid protection system may comprise the protection disconnector and a surge arrester 120 according to one or more embodiments of the present disclosure. The disconnector device 110 and the surge arrester 120 may be connected in series along the grounding path 190. The grounding path 190 connects the phase 130 of the power distribution or transmission grid through the surge arrester 120 and the disconnector device 110 to ground 140. The leakage current sensor may be configured for measuring the leakage current $I_L$, flowing along the grounding path 190.

A further embodiment of the present disclosure may provide a method for monitoring an electrical connection status of a disconnector device 110 of a grid protection system which protects a power distribution or transmission grid from damage in case of a power surge.

The grid protection system may include the disconnector device 110 and a surge arrester 120 connected in series along a grounding path 190, the grounding path 190 connecting a phase 130 of a power distribution or transmission grid through the surge arrester 120 and the disconnector device 110 to ground 140. The disconnector device 110 being configured for being activated in case of an overload condition, thereby disconnecting the surge arrester 120, e.g., disconnecting the surge arrester 120 from the grid or from ground, the method comprising: measuring, by a leakage current sensor, a leakage current $I_L$ flowing along the grounding path 190; determining, based on the measured leakage current $I_L$, an electrical connection status of the disconnector device 110, the electrical connection status being one of an activated and an inactivated status of the disconnector device 110.

In a further embodiment, the method for monitoring an electrical connection status according to one or more embodiments of the present disclosure, may further comprise to determine a grid status of the power distribution or transmission grid. This may e.g. be a status of one or more phases 130 of the power distribution or transmission grid. The grid status may be one of an active status, meaning energized and an inactive status, meaning not-energized. The method may further comprise to determine, from the leakage current $I_L$ and the grid status data, the electrical connection status of the disconnector device 110.

In particular the determining of the grid status may be based on a measured leakage current (e.g., the measured leakage current of a plurality of leakage current measuring devices): In this case, the grid status may be determined to be an active or inactive status in dependence of the measured leakage current $I_L$. For example, the grid status may be determined to be an inactive status under the condition, that all of a plurality of leakage current measuring devices measure a below-threshold leakage current for a predetermined grid-determining leakage current threshold; and otherwise to be an active status.

In particular the determining of the electrical connection status may also be based on a measured leakage current (e.g., the measured leakage current of a given leakage current measuring devices): In this case, the electrical connection status may be determined to be an activated or inactivated status in dependence of the measured leakage current $I_L$. For example, the electrical connection status of the disconnector device 110 may be determined as an activated status under the condition that the measured leakage current $I_L$ is indicative of an absent leakage current (zero or below-threshold leakage current for a given disconnector-relevant threshold) through the disconnector device 110, and that the grid status data is indicative of an active grid status of the power distribution or transmission grid. Further, the electrical connection status of the disconnector device 110 may be determined as an inactivated status under the condition that the measured leakage current $I_L$ is indicative of a leakage current (above-threshold leakage current for a given disconnector-relevant threshold) through the disconnector device 110.

The measured leakage current $I_L$ can be a component of a superposition of two or more currents, in other words a sum-current, of respective leakage currents $I_{L1}$, $I_{L2}$, $I_{L3}$ from each of the phases (L1, L2, L3) through respective disconnector devices. In this case, the measured leakage current $I_L$ is indicative of the leakage currents $I_{L1}$, $I_{L2}$, $I_{L3}$.

The invention claimed is:

1. A leakage current measuring device for a grid protection system protecting a power distribution or transmission grid from damage in case of a power surge,
    the grid protection system including a disconnector device and a surge arrester connected in series along a grounding path, the grounding path connecting a phase of a power distribution or transmission grid through the surge arrester and the disconnector device to ground,
    the disconnector device being configured for being activated in case of an overload condition, thereby disconnecting the surge arrester,
    the leakage current measuring device comprising:
        a leakage current sensor for measuring a leakage current $I_L$ flowing along the grounding path,
        the leakage current $I_L$ being indicative of the electrical connection status of the disconnector device, the electrical connection status being one of an activated and an inactivated status of the disconnector device; and
        a determining section configured to determine the electrical connection status from the leakage current $I_L$.

2. The leakage current measuring device according to claim 1, further comprising an output section adapted to output leakage current data indicative of the leakage current $I_L$ to the determining section.

3. The leakage current measuring device according to claim 1, further comprising an energy supply comprising at least one of a battery and an energy harvesting system having a circuit arrangement for harvesting energy from the leakage current flowing along the grounding path.

4. The leakage current measuring device according to claim 1, further configured to measure a voltage in the grounding path.

5. An electrical connection status determining unit configured to be connected to the leakage current measuring device according to claim 1, the electrical connection status determining unit comprising:
    an input section configured to receive, from the leakage current measuring device, leakage current data indicative of the leakage current $I_L$.

6. The electrical connection status determining unit according to claim 5, wherein
    the input section is further configured to receive grid status data indicative of a grid status of the power distribution or transmission grid, the grid status being one of active and inactive, and wherein
    the determining section is configured to determine, from the leakage current data and the grid status data, the electrical connection status of the disconnector device.

7. The electrical connection status determining unit according to claim 6, further comprising at least one of
    a grid voltage or current measurement device for measuring the grid voltage or current, and for transmitting the grid voltage or current as the grid status data to the input section;

a grid-system data connection to a grid monitoring system, the input section being configured to receive, from the grid monitoring system, the grid status data over the data connection; and a leakage-current data connection to a further leakage current measuring device, wherein the input section is configured to receive, from the further leakage current measuring device, further leakage current data over the leakage-current data connection, the further leakage current data being indicative of at least one further leakage current ($I_{L2}$) flowing along at least one further grounding, wherein the further leakage current data is comprised in the grid status data.

8. The electrical connection status determining unit according to claim 6, wherein the determining section is configured to determine the electrical connection status of the disconnector device is an inactivated status under the condition that the leakage current data indicates a leakage current component through the disconnector device, and wherein the determining section is configured to determine that the electrical connection status of the disconnector device is an activated status under the condition that the leakage current data indicates a zero or low leakage current component through the disconnector device and that the grid status data is indicative of an active grid status of the phase of the power distribution or transmission grid.

9. An electrical connection status monitoring system comprising an electrical connection status determining unit and a leakage current measuring device, a leakage current measuring device comprising a leakage current sensor for measuring a leakage current $I_L$ flowing along a grounding path, the leakage current $I_L$ being indicative of the electrical connection status of a disconnector device, the electrical connection status being one of an activated and an inactivated status of the disconnector device, an electrical connection status determining unit configured to be connected to the leakage current measuring device, the electrical connection status determining unit comprising:

an input section configured to receive, from the leakage current measuring device, leakage current data indicative of the leakage current $I_L$, a determining section, the determining section being configured to determine, from the leakage current data, the electrical connection status of the disconnector device, and an energy supply comprising at least one of a battery and an energy harvesting system having a circuit arrangement for harvesting energy from the leakage current flowing along the grounding path, wherein the electrical connection status determining unit is connected to the leakage current measuring device for receiving the leakage current data from the leakage current measuring device.

10. The electrical connection status monitoring system according to claim 9, wherein at least the leakage current measuring device and the electrical connection status determining unit are provided as an integrated unit with a common housing.

11. The electrical connection status monitoring system according to claim 9, wherein the electrical connection status determining unit is located remotely from the leakage current measuring device and is connected to the leakage current measuring device via a data line and/or data network.

12. The electrical connection status monitoring system according to claim 9, comprising a plurality of leakage current measuring device with a respective leakage current measuring device provided for each phase of a power distribution or transmission grid.

13. The electrical connection status monitoring system according to claim 9, wherein grounding paths for at least two of the phases of the power distribution or transmission grid merge into a common grounding path section, and wherein the leakage current measuring device is arranged for measuring the leakage current flowing through the common grounding path section.

14. A protection disconnector system for protecting a surge arrester in a power distribution or transmission grid, the protection disconnector system comprising:

a disconnector device being connectable to the surge arrester and being configured for being activated in case of an overload condition, thereby disconnecting the surge arrester; and the electrical connection status monitoring system according to claim 10, the leakage current measuring device being operatively connected to the grounding path for measuring the leakage current $I_L$ flowing along the grounding path.

15. The protection disconnector system according to claim 14, wherein the disconnector device is adapted to be activated for disconnecting the surge arrester in case of an overload condition.

16. A grid protection system for protecting a power distribution or transmission grid from damage in case of a power surge, the grid protection system comprising the protection disconnector system according to claim 14, and a surge arrester, wherein the disconnector device and the surge arrester are connected in series along the grounding path, the grounding path connecting the phase of the power distribution or transmission grid through the surge arrester and the disconnector device to ground, and wherein the leakage current sensor is configured for measuring the leakage current $I_L$ flowing along the grounding path.

17. A method for monitoring an electrical connection status of a disconnector device of a grid protection system protecting a power distribution or transmission grid from damage in case of a power surge, the grid protection system including the disconnector device and a surge arrester connected in series along a grounding path, the grounding path connecting a phase of a power distribution or transmission grid through the surge arrester and the disconnector device to ground, the disconnector device being configured for being activated in case of an overload condition, thereby disconnecting the surge arrester, the method comprising:

measuring, by a leakage current sensor, a leakage current $I_L$ flowing along the grounding path; and determining, by a determining section based on the measured leakage current $I_L$, an electrical connection status of the disconnector device, the electrical connection status being one of an activated and an inactivated status of the disconnector device.

18. The method for monitoring an electrical connection status according to claim 17, further comprising:

determining a grid status of the power distribution or transmission, the grid status being one of active and inactive, and determining, from the leakage current $I_L$ and the grid status, the electrical connection status of the disconnector device.

19. The electrical connection status monitoring system according to claim 9, the leakage current measuring further comprising an output section adapted to output leakage current data indicative of the leakage current $I_L$ to a determining section, wherein the determining section is configured to determine the electrical connection status from the leakage current $I_L$.

* * * * *